US005194834A

United States Patent [19]

Bacher et al.

[11] Patent Number: 5,194,834

[45] Date of Patent: Mar. 16, 1993

[54] APPARATUS FOR A MATCHED AND ADJUSTABLE MICROWAVE FREQUENCY SELECTIVE ATTENUATOR UNIT

[75] Inventors: Helmut Bacher, Newark, Calif.; Clyfton W. Bourne, Jr., Mesa; Bradley Knott, Phoenix, both of Ariz.

[73] Assignee: Semflex, Inc., Mesa, Ariz.

[21] Appl. No.: 714,888

[22] Filed: Jun. 13, 1991

[51] Int. Cl.[5] .......... H03H 7/24; H01P 1/22

[52] U.S. Cl. .......... 333/81 A; 333/28 R

[58] Field of Search .......... 333/28 R, 81 A, 170

[56] References Cited

U.S. PATENT DOCUMENTS

| | | | |
|---|---|---|---|
| 3,648,200 | 3/1972 | Harrison et al. | 333/81 A X |
| 4,117,425 | 9/1978 | Bacher | 333/81 A |
| 5,039,961 | 8/1991 | Veteran | 333/81 A |

*Primary Examiner*—Paul Gensler
*Attorney, Agent, or Firm*—William W. Holloway; Charles E. Cates

[57] ABSTRACT

Apparatus and a method are disclosed for providing a microwave attenuator system using distributed (transmission line) reactive elements to achieve a reduction in the transmitted electrical signal amplitude. The attenuator system includes a fixed attenuator unit and an adjustable attenuator unit. The fixed attenuator unit contains a "T" resistive attenuator component. Transmission line resonator components are added to the attenuator component to provide frequency selectively. The transmission line resonator components are coupled to the resistive attenuator component in such a way as not to compromise the impedance match of the transmission line. The step adjustable loss component includes shunt transmission lines coupled to the center conductor of the transmission line by means of a spring contacting mechanism. The shunt transmission lines include preselected resistive elements. The preselected resistive elements provide incremental known attenuation characteristics for manual fine response step adjustments.

18 Claims, 6 Drawing Sheets

VARIABLE LOSS INSERTS

APPARATUS FOR A MATCHED AND ADJUSTABLE MICROWAVE FREQUENCY SELECTIVE ATTENUATOR UNIT

BACKGROUND OF THE INVENTION

1. Field of the Invention

This invention relates generally to microwave transmission equipment and, more particularly, to attenuator (equalizer) units which alter the signal attenuation frequency response of the transmission lines, traveling wave tubes, and microwave systems.

2. Description of the Related Art

The use of attenuator units in microwave applications for controlling the frequency response of microwave components is well known. In U.S. Pat. No. 3,648,200, entitled Frequency Selective Attenuation Apparatus, issued on Mar. 17, 1969 to W. H. Harrison et al., and U.S. Pat. No. 4,117,425 issued to H. Bacher on Sep. 26, 1978, an attenuator unit including a pair of tuning stubs, spaced approximately a quarter wavelength apart, is disclosed. The attenuation characteristic of the attenuation unit can be determined by the frequency of the incident energy and by the length of the tuning stubs. The impedance changes induced by one stub receive partial compensation by positioning the second stub at one quarter wavelength distance from the first stub. The attenuator unit configuration described by the referenced U.S. patents has two primary disadvantages. First, the required quarter wave spacing between the stubs limits the utility of the attenuator unit to a relatively narrow frequency range. Second, at frequencies other than the frequency for which the distance between the tuning stubs is a quarter wave, substantial energy is reflected back toward the signal source rather than being dissipated by the attenuator unit. In addition, and partially as a result of limiting the frequency range to a region determined by the spacing of the stubs, signals propagated along the transmission line have a frequency dependent delay. Devices used to fine tune frequency response of the attenuator unit present severe difficulties that require tedious manual adjustment to achieve the desired frequency response and, once achieved, the frequency response is unstable with temperature variations.

A need has therefore been felt to provide an attenuator unit which exhibits a nearly constant input and output (i.e., matched) impedance and exhibits a nearly constant delay over a very wide frequency range. A need has also been felt to provide manual adjustments for which the frequency response remains constant with temperature.

FEATURES OF THE INVENTION

It is an object of the present invention to provide an improved microwave, frequency selective, attenuator unit.

It is a feature of the present invention to provide an improved frequency selective attenuator unit with a substantially constant input and output impedance from zero (DC) frequency to the first non-TEM propagation (mode) frequency of the coaxial transmission line.

It is still another feature of the present invention to provide an attenuator unit having propagation delay which is nearly constant over a wide range of frequencies.

It is yet another feature of the present invention to provide a conveniently adjustable, temperature independent attenuator unit with a plurality of preselected attenuator increments.

It is a further feature of the present invention to provide a frequency selective attenuator unit for a microwave system having two attenuator components. One of the attenuator components is an attenuator component with transmission line resonators coupled thereto and acting in conjugate fashion to provide frequency selectivity while maintaining a constant impedance. The second attenuator component is a tuning element shunt transmission line resonator with the capability of being detachably coupled to the main transmission line.

SUMMARY OF THE INVENTION

The aforementioned and other features are attained, according to the present invention, by providing a microwave, frequency selective, attenuator unit with a fixed attenuator component and an adjustable attenuator component. The fixed attenuator component contributes the majority of the loss and impedance match to the attenuator unit. This fixed attenuator component consists of a resistive attenuator components to which transmission line resonator components have been added. The variable attenuator component is detachably coupled to the transmission line and has step adjustable elements. The step adjustable elements provide incremental loss additions for predictable, convenient adjustments to the attenuator unit's frequency response. Typical step adjustment elements include 0.5 dB, 1 dB, and 2 dB elements. These step adjustment elements permit any 0.5 dB attenuation combination from 0.5 dB to 3.5 dB to be present in the variable attenuator component. The adjustable components consist of spring contacted transmission line elements which can be electrically coupled to a transmission line.

These and other features of the present invention will be understood upon reading of the following description along with the drawings.

BRIEF DESCRIPTION OF THE DRAWINGS

FIG. 3A shows an exploded view of fixed frequency dependent attenuator component, while

FIG. 4A is an exploded view of the adjustable component of the attenuator unit according to the present invention, while

DESCRIPTION OF THE PREFERRED EMBODIMENT

1. Detailed Description of the Figures

Figure 1:
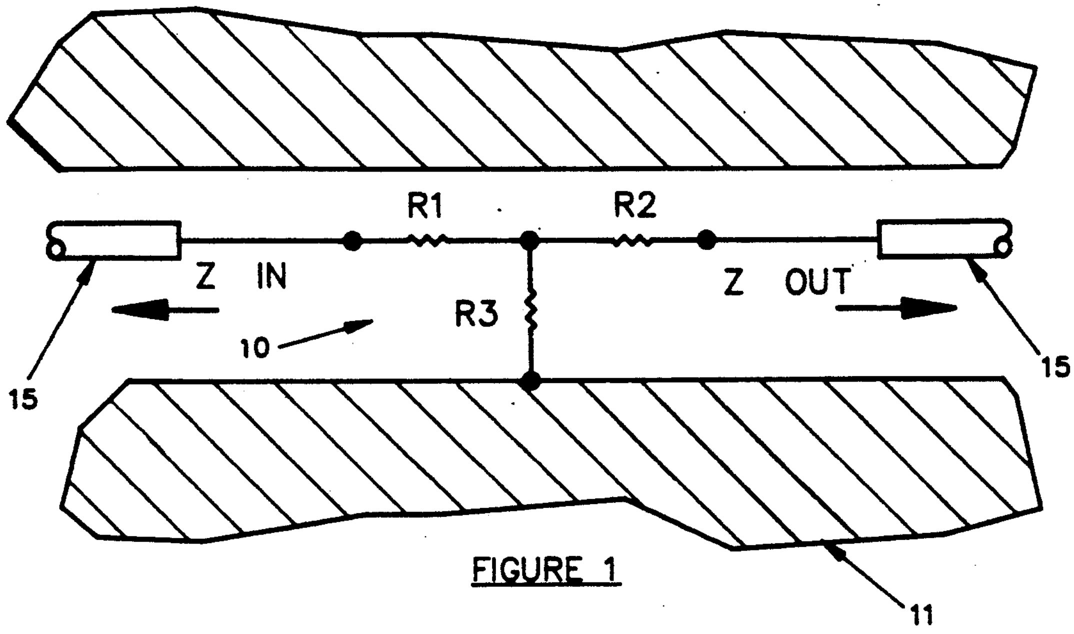
FIGURE 1 PRIOR ART
FIG. 1 shows a resistive attenuator component according to the prior art.

Referring to FIG. 1, a "T" resistive attenuator component, according to the prior art, is shown. The "T" attenuator component 10 has a first terminal of resistor R1 coupled to a center conductor 15 of an input portion of the through transmission line. The second terminal of resistor R1 is coupled to a first terminal of resistor R2 and to the first terminal of resistor R3. A second terminal of R2 is coupled to the center conductor 15 of an output portion of a transmission line. The second terminal of resistor R3 is coupled to the housing 11 of the through transmission line. The housing 11 is a common outer conductor of both the output and input portions of the through transmission line. The "T" attenuator component 10 is designed to introduce a constant loss when positioned between the input transmission line impedance Zin and the output transmission line impedance Zout. When the resistor values for R1, R2, and R3 are appropriately selected, the input and output impedances of the "T" attenuator component match the impedances of transmission line impedances Zin and Zout.

Figure 2:
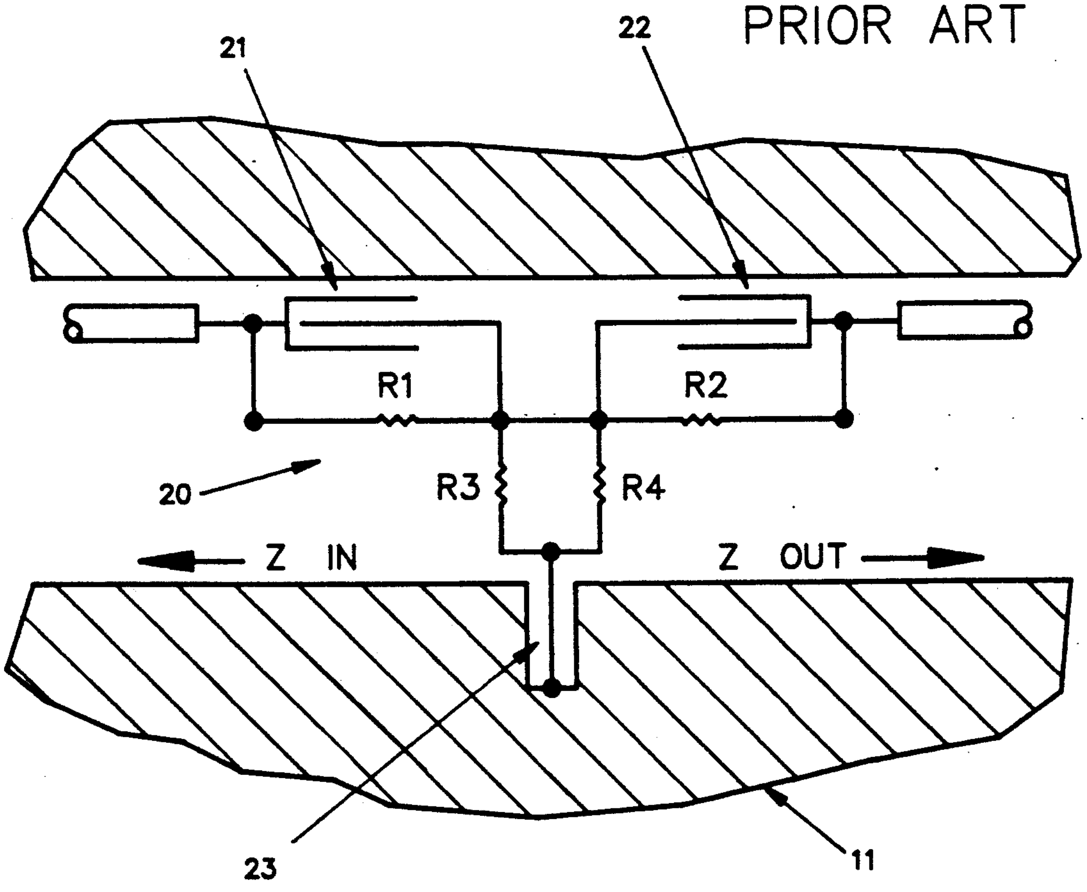
FIG. 2 shows a circuit diagram of a fixed frequency dependent attenuator component according to the present invention.

Referring to FIG. 2, a circuit diagram of the fixed frequency dependent attenuator component 20 of the attenuator unit, according to the present invention, is shown. The fixed component includes a modified "T" resistive attenuator 10 unit as shown in FIG. 1. Coupled to the bridged "T" attenuator unit are transmission line resonator components. An open transmission line resonator component 21 is coupled in parallel with the input resistor R1. A second open transmission line resonator component 22 is coupled in parallel with the output resistor R2. A shorted transmission line resonator component 23 is coupled between the shunt resistors R3 and R4 and the housing 11.

Figure 3A:
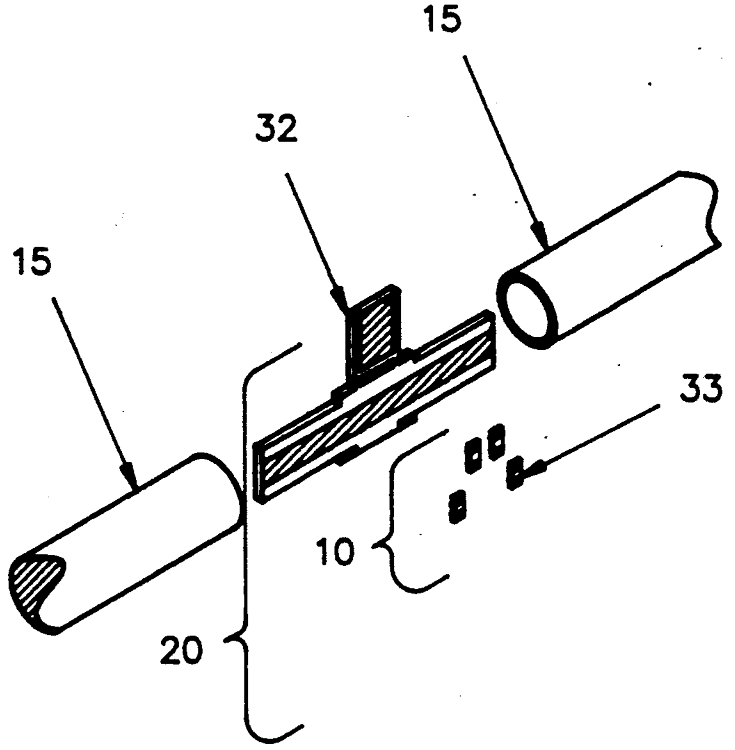

Referring to FIG. 3A, an exploded view of the fixed attenuator component is shown. The through transmission line center conductors 15 are separated to permit the fixed attenuator component 20 to be inserted therebetween. For best cost efficiency, one suspended substrate stripline element 32 is used to implement all the resonant transmission line elements and coupled resistors 33. The shunt element transmission line resonator uses the metal housing 11 of the through transmission line as an outer conductor. The series open transmission line resonator elements 21 and 22 are fitted into the inside diameter of the metal center conductor 15. The inside diameters of the center conductors 15 portions act as shielded outer conductors for the open transmission line resonators elements. The outside diameter of the center conductor is set into a standard coaxial transmission line housing 11. This construction prevents undesirable coupling effects between the series resonator transmission lines of 32 and the ground plane of the housing 11. Resistors 33 are used to form the "T" attenuator unit 10. o Referring to FIG. 3B, the elements described with respect to FIG. 3A are shown as assembled and incorporated in a transmission line housing 11, the elements being similarly labeled in FIG. 3A and FIG. 3B.

Figure 4A:
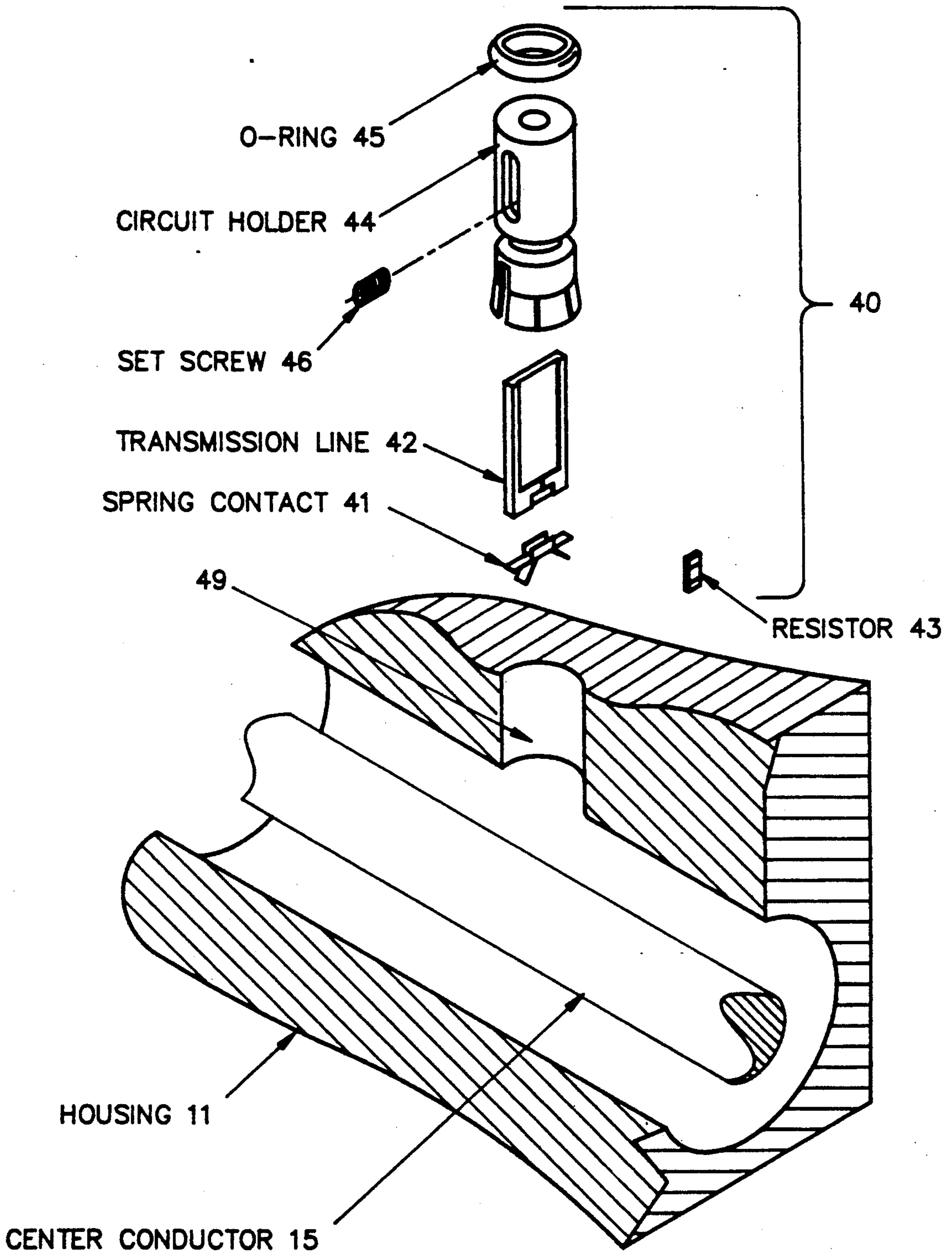

Referring to FIG. 4A, an exploded view of the adjustable attenuator component 40 of the attenuator unit, according to the present invention, is shown. Spring contact 41 is used to provide electrical coupling to the center-conductor 15, the adjustable component 40 being inserted through aperture (49) in housing 11. The spring contact 41 is connected to a resonant transmission line 42 through resistor 43. Resonant transmission line 42 is mechanically attached and electrically coupled to the circuit holder 44. The circuit holder 44 provides a spring contact for the adjustable attenuator component 40 to aperture 49 of the housing 11, the housing 11 being at ground potential. The O-ring 45 maintains an environmental seal and a set screw 46 locks the desired "on" (in) or "off" (out) positions for adjustable attenuator component 40 in aperture 49. The set screw 46 rides in a channel in the circuit holder 44 to maintain the required orientation of the spring contact to the center conductor 15. Each attenuator component 40 is contacted to the metal center conductor 15 and to the metal ground plane, i.e., the housing 11, by means of spring contacts. The shunt resistive elements 43 can be easily coupled and uncoupled to the adjustable attenuator component 40 and consequently to the electric field in the through transmission line, thereby changing the frequency response of the adjustable attenuator component. The combination of the transmission line, the spring contact (to the center conductor), and movable grounding to the housing 11 provides for convenient and predictable adjustments of the attenuation as a function of the frequency response.

Figure 4B:
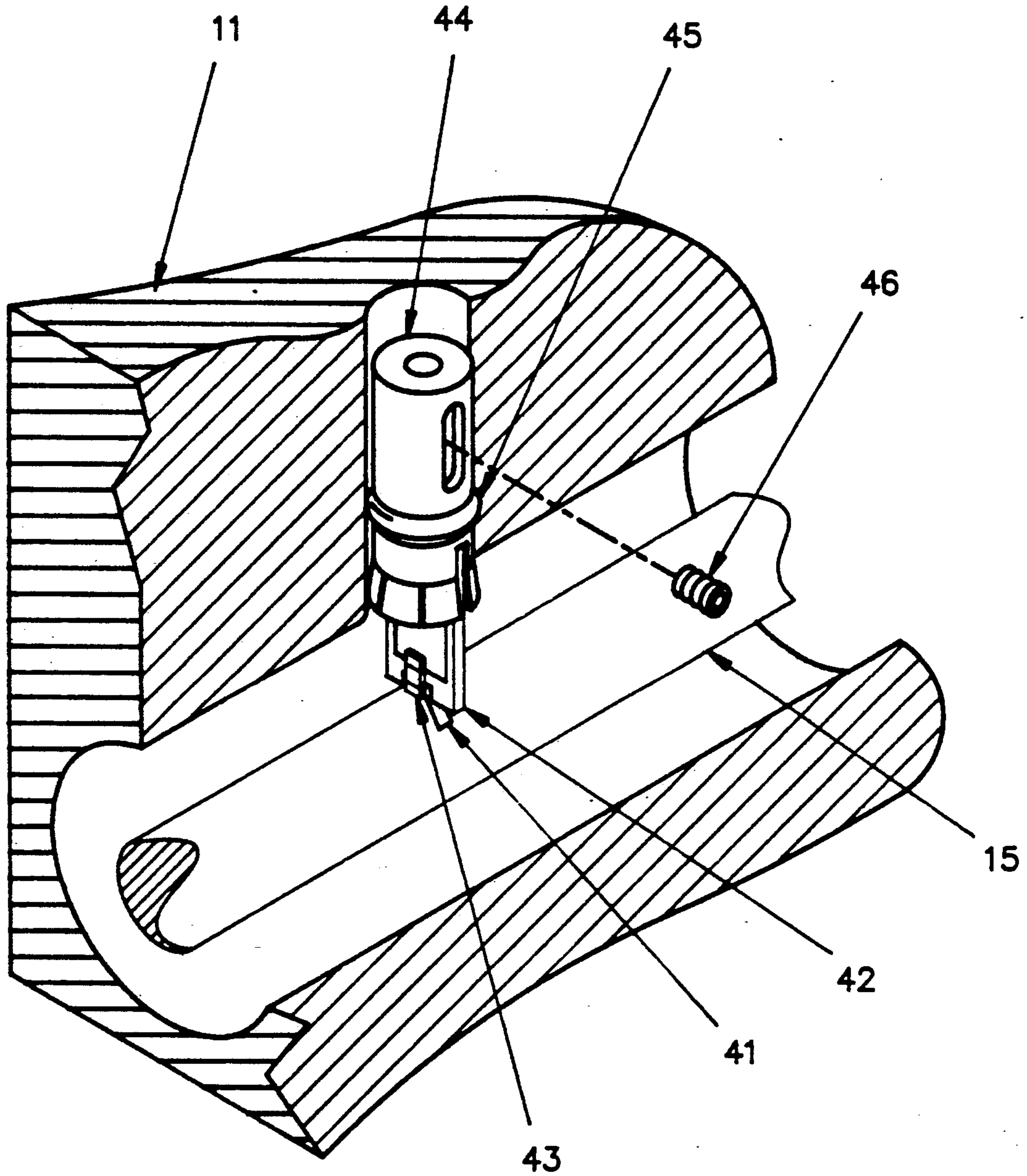
FIG. 4B shows an assembled adjustable frequency dependent attenuator component.

Referring to FIG. 4B, the elements described with respect to FIG. 4A are shown as assembled and incorporated in a transmission line housing 11, the elements being similarly labelled in FIGS. 4A and 4B.

Figure 5:
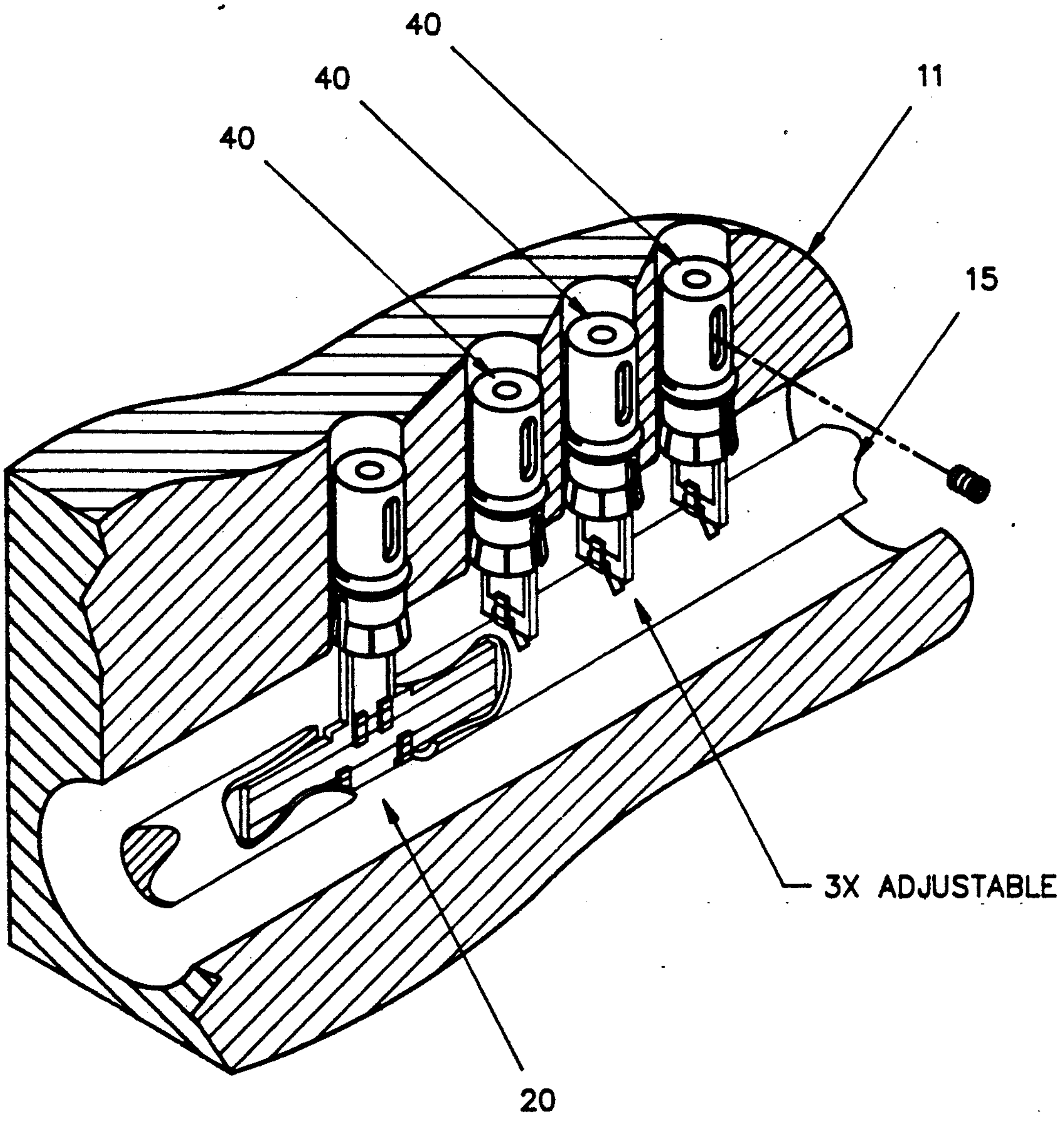
FIG. 5 shows a view of the complete frequency dependent attenuator unit of the present invention illustrating the relationship of the fixed attenuator component and variable attenuator components.

Referring to FIG. 5, the configuration of the attenuator unit according to the present invention is shown. The two components, the fixed attenuator component 20 and adjustable attenuator components 40 are shown, the apparatus being embedded in the housing of the through transmission line.

2. Operation of the Preferred Embodiment

Figure 3B:
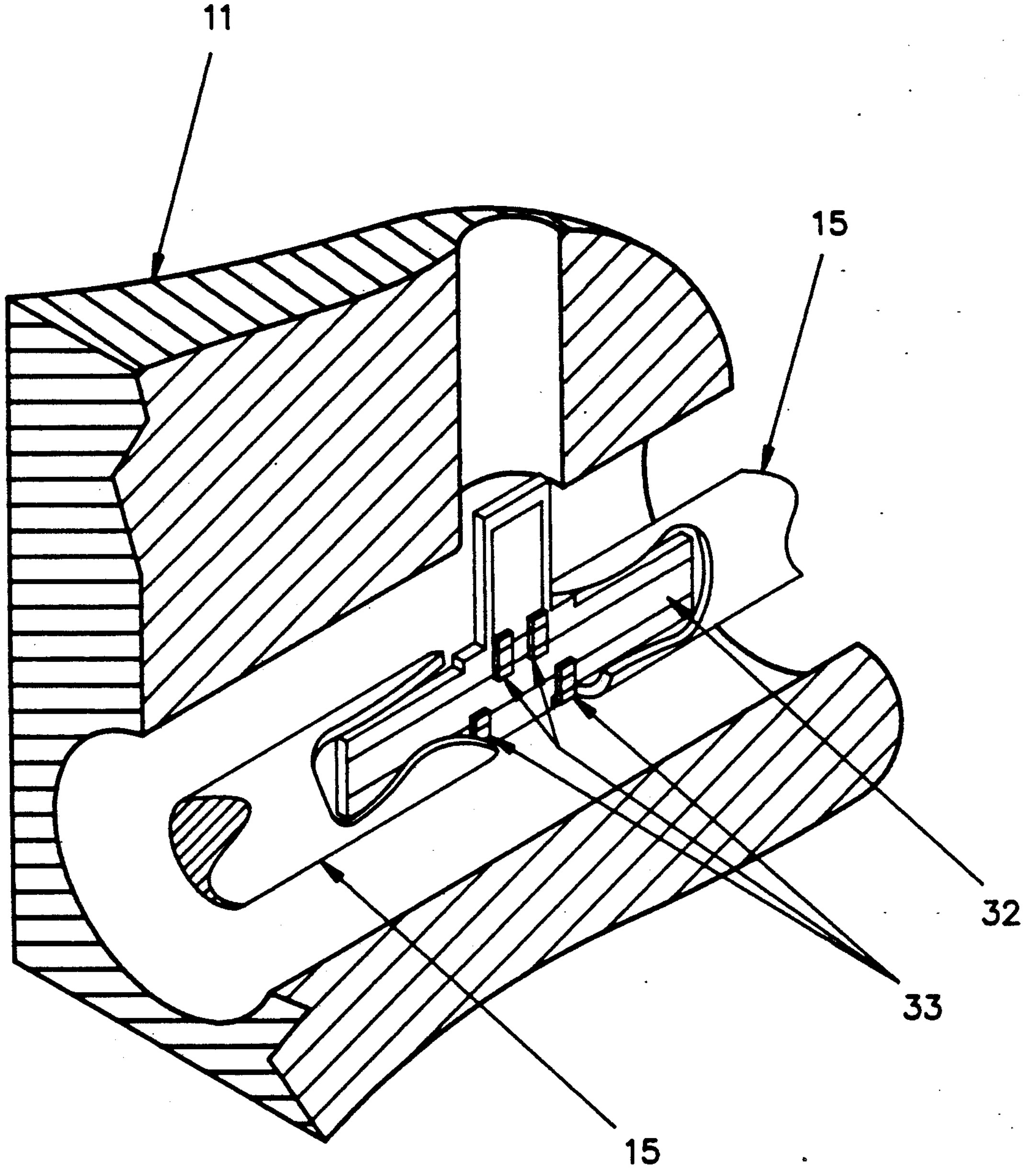
FIG. 3B shows an assembled fixed frequency dependent attenuator component.

The attenuator unit of the present invention provides the frequency selectivity that is primarily determined by the fixed component shown in FIG. 2, FIG. 3A, and FIG. 3B. For zero and low frequencies, a portion of energy traversing the equalizer along the through transmission line is dissipated by the resistive network, R1, R2, R3, and R4. The attenuation of the network is determined by the choice of resistance values, the input Zin impedance and the output Zout impedance. The resistance and the impedance values are related by the following equations;

$$R1=R2=Z^{*}\tanh(a/2)$$

$$R3=R4=Z/2^{*}\sinh(a)$$

$$Z=Zin=Zout$$

where a is the attenuation in nepers.

By way of specific example, using values of R1=R2=16.67 ohms; R3=R4=133 ohms; and Zin=Zout=50 ohms, the attenuator component of FIG. 2 yields a 6 dB ratio of input power to output power. The transmission line resonator elements do not affect the zero (D.C.) frequency operation of the attenuator. At microwave frequencies, a standing wave develops in the transmission line resonator elements caused by the discontinuous end (open or short) of each transmission line. This standing wave causes the input impedance of the open transmission line to approach zero as the wavelength of microwave energy approaches odd quarter wavelengths of the resonator element length. Conversely, the shorted transmission line resonator element input impedance approaches infinity at odd quarter wavelengths. Therefore, at odd quarter wavelength frequencies, the open resonator element provides a short circuit for the microwave energy flowing through the series resistive network R1 and R2. The shorted resonator element blocks microwave energy from passing to ground through R3 or R4. Two shunt resistors are employed to better preserve symmetry between the open and the shorted attenuator elements. Furthermore, continued matching of the attenuator impedance over all frequencies can be achieved when the characteristic impedances are calculated according to the following equation:

$$Zin = Zout = (Z_{open} * Z_{short})^{\frac{1}{2}}$$

where:

$Z_{open}$ = open circuit resonator component impedance; and $Z_{short}$ = short circuited resonator element impedance.

The use of the resonator transmission line elements having the foregoing values provides three advantages for the present invention; a) broadband operation, b) constant delay through the attenuator, and c) the incorporation of the series resonator into the center conductor of the through transmission line (triaxial construction) prevents undesirable coupling effects between the open circuited resonator transmission line elements and the housing conductor.

The type of resonator transmission line elements shown in FIG. 2 can be exchanged so that the open circuited resonator transmission line elements become short circuited resonator elements and the short circuited resonator transmission line elements become open circuited resonator transmission line elements. The frequency response of the unit is inverted but the unit retains all the listed advantages over prior art.

The attenuator unit of present invention provides a secondary field adjustable response determined by the adjustable attenuator component. The adjustable component adds moderate attenuation to the unit by coupling incremental loss resonators to the center conductor of the through transmission line. These incremental elements are temperature stable and easily coupled and uncoupled to the adjustable attenuator element through the use of two spring contacts and an aperture in the housing. A standing wave is established in the transmission line element due to the discontinuous end. This sets up resonant points at odd quarter wave frequencies. A resistor between the front spring contact and the transmission line resonator determines the amount of added attenuation. The mismatch introduced onto the through transmission line is modest due to the low attenuation required for fine tuning. These discontinuities do not significantly affect the attenuator units matching or delay linearity.

The foregoing description is included to illustrate the operation of the preferred embodiment and is not meant to limit the scope of the invention. The scope of the invention is to be limited only by the following claims. From the foregoing description, many variations will be apparent to those skilled in the art that would yet be encompassed by the spirit and scope of the invention.

What is claimed is:

1. A carry through attenuator unit for use in a microwave transmission line, said attenuator unit comprising:

a fixed attenuator component coupled between portions of a center conductor of said transmission line, said fixed attenuator component including a resistive attenuator element, said fixed component having at least one open circuit transmission line resonator unit and at least one short circuited transmission line resonator unit coupled thereto, said fixed attenuator component determining a frequency response of said attenuator unit; and at least one adjustable attenuator component having replaceable resistive elements, said adjustable component detachably coupled to said transmission line, said adjustable attenuator component providing incremental adjustment to said frequency response. r 2. The attenuator unit of claim 1 wherein said resistive attenuator element is a "T" attenuator unit, each series resistor of said "T" attenuator unit having a first transmission line resonator unit coupled in parallel therewith, said transmission line resonator unit being positioned at least partially within and shielded by said center conductor.

3. The attenuator unit of claim 2 wherein a third resistor of said "T" attenuator unit is coupled in series with a second transmission line resonator unit, said second transmission line resonator unit being shielded at least partially by an outer conductor of said transmission line.

4. The attenuator unit of claim 1 wherein said adjustable attenuator component includes:

a first spring mechanism for coupling to a center conductor of said transmission line; and a second spring mechanism for coupling to a housing of said transmission line, said transmission line housing having an aperture into which said adjustable attenuator component can be inserted.

5. The attenuator unit of claim 2 wherein said resonator units are suspended substrate striplines.

6. The attenuator unit of claim 2 wherein said open and said short circuited resonator units have impedances related to input impedance Zin and output impedance Zout by a formula;

$$Zin = Zout = (Z_{short} * Z_{open})^{\frac{1}{2}}$$

where $Z_{short}$ is an impedance of the short circuited resonator unit; and $Z_{open}$ is an impedance of the open circuited resonator unit.

7. The attenuator unit of claim 2 wherein said fixed and said adjustable attenuator components have a relative location on said transmission line that is frequency independent.

8. An attenuator unit for a transmission line, said attenuator unit having a predetermined frequency response for said attenuator unit, said attenuator unit comprising:

a fixed frequency attenuator component, said fixed frequency attenuator component having a resistor attenuator element coupled between portions of a center conductor, said fixed frequency attenuator component having at least one first resonator coupled in between said portions of said transmission line center conductor, said fixed frequency attenuator component having at least one second resonator coupled between said resistor attenuator element and a housing of said transmission line; and at least one adjustable attenuator component adapted to have at least one resistor detachably coupled thereto, said adjustable attenuator component adapted to be detachably coupled to said transmission line, said adjustable attenuator component having a first spring member for coupling said adjustable attenuator component to said center conductor and a second spring member for coupling said adjustable attenuator component to a housing of said transmission line, said at least one resistor determining a signal attenuation for said adjustable attenuator component.

9. The attenuator unit of claim 8 wherein said resistor attenuator element is a T attenuator element, wherein first resistors of said T attenuator element are coupled in series between said center conductor portions, a second resistor of said T attenuator element coupled between said first resistors and said housing of said transmission line, wherein said first resonator is coupled in parallel with each of said first resistors, said second resonator being coupled in series with said second resistor.

10. The attenuator unit of claim 9 wherein said first resonator is an open circuited transmission line resonator element and said second resonator is a short circuited transmission line resonator element.

11. The attenuator unit of claim 9 wherein said first resonator is a short circuited transmission line resonator element and said second resonator element is an open circuited transmission line resonator element.

12. The attenuator unit of claim 9 wherein said first and said second resonators are suspended substrate striplines.

13. The attenuator unit of claim 9 wherein a distance between said fixed frequency attenuator component and said adjustable attenuator component is frequency independent.

14. The attenuator unit of claim 9 wherein said first and said second resonators have impedances related to input impedance Zin and output impedance Zout by a formula;

$$Zin = Zout = (Z_{first} * Z_{second})^{\frac{1}{2}}$$

where $Z_{first}$ is an impedance of said first resonator; and $Z_{open}$ is an impedance of said second resonator.

15. The attenuator unit of claim 9 wherein said adjustable attenuator component includes a first spring mechanism for engaging said transmission line center conductor and a second spring mechanism for engaging walls of an aperture in said transmission line housing.

16. The attenuator unit of claim 15 wherein said at least one detachable resistor provides incremental changes in impedance, said incremental changes in said impedance resulting in incremental changes in attenuation of said attenuator unit.

17. The attenuator unit of claim 12 wherein said fixed attenuator component includes detachable resistors for coupling to a stripline, said detachable resistors implementing said T attenuator element.

18. The attenuator unit of claim 12 wherein a portion of a stripline is electrically coupled to a housing of said transmission line.

* * * * *